United States Patent [19]
Sasaki

[11] Patent Number: 5,408,499
[45] Date of Patent: Apr. 18, 1995

[54] MULTILEVEL CODE FOR TRANSMISSION DEVICE

[75] Inventor: Eisaku Sasaki, Tokyo, Japan

[73] Assignee: NEC Corporation, Tokyo, Japan

[21] Appl. No.: 181,033

[22] Filed: Jan. 14, 1994

[30] Foreign Application Priority Data

Jan. 14, 1993 [JP] Japan ................... 5-005331

[51] Int. Cl.$^6$ ................... H03M 1/00; H04L 25/34
[52] U.S. Cl. ................... 375/286; 329/304;
332/103; 371/43; 375/244; 375/264; 375/308;
375/329
[58] Field of Search ................... 375/17, 27, 39, 42,
375/67, 83, 86, 94; 329/304, 300; 332/100, 103;
371/43

[56] References Cited

U.S. PATENT DOCUMENTS

| | | | |
|---|---|---|---|
| 3,829,779 | 8/1974 | Fujimoto | 375/18 |
| 4,483,012 | 11/1984 | Wei | 375/27 |
| 4,493,082 | 1/1985 | Cumberton et al. | 371/43 |
| 4,583,236 | 4/1986 | Kromer et al. | 375/17 |
| 4,601,044 | 7/1986 | Kromer, III et al. | 375/17 |
| 4,716,385 | 12/1987 | Noda et al. | 375/39 |
| 5,023,889 | 6/1991 | Divsalar et al. | 375/27 |
| 5,054,036 | 10/1991 | Brownlie et al. | 375/27 |
| 5,113,412 | 5/1992 | Goldstein | 375/39 |
| 5,115,453 | 5/1992 | Calderbank et al. | 375/39 |
| 5,124,979 | 6/1992 | Matui | 375/17 |
| 5,233,630 | 8/1993 | Wolf | 371/43 |
| 5,258,987 | 11/1993 | Wei | 371/43 |

OTHER PUBLICATIONS

H. Imai, S. Hirakawa, "A New Multilevel Coding Method Using Error-Correction Codes", IEEE Trans. Inf. Theory, vol. IT-23, pp. 371-377.

G. Ungerboeck, "Trellis-Coded Modulation with Redundant Signal Sets Part 1", IEEE Com. Mag., vol. 25, pp. 5-11, Feb. 1987.

G. Ungerboeck, "Trellis-Coded Modulation with Redundant Signal Sets Part 2", IEEE Com. Mag., vol. 25, pp. 12-21, Feb. 1987.

Primary Examiner—Stephen Chin
Assistant Examiner—Young Tse
Attorney, Agent, or Firm—Sughrue, Mion, Zinn, Macpeak & Seas

[57] ABSTRACT

Multilevel coded modulation equipment includes a transmission unit and a reception unit. The transmission unit includes a first converting unit, a first encoding unit, a first differential encoding unit, a second encoding unit, a mapping unit, and a modulating unit. The reception unit includes a demodulating unit, a first decoding unit, an inverting unit, a phase shifting unit, a second decoding unit, a differential decoding unit, a decision unit, and a second converting unit. The first converting unit distributes an input serial digital signal to a plurality of levels containing a level 1 indicating a level which is transparent to a 90° phase ambiguity, and a level 2 indicating a level which is transparent to a 180° phase rotation. The second converting unit receives outputs from the inverting unit, the differential decoding unit, and the decision unit, multiplexes the received signals into a serial digital signal, and outputs the serial digital signal.

10 Claims, 6 Drawing Sheets

LEVEL 1

| 0 | 1 | 0 | 1 |
|---|---|---|---|
| 1 | 0 | 1 | 0 |
| 0 | 1 | 0 | 1 |
| 1 | 0 | 1 | 0 |

FIG.5A

LEVEL 2

| 0 | 0 | 0 | 0 |
|---|---|---|---|
| 1 | 1 | 1 | 1 |
| 0 | 0 | 0 | 0 |
| 1 | 1 | 1 | 1 |

FIG.5B

LEVEL 3

| 0 | 0 | 1 | 1 |
|---|---|---|---|
| 0 | 0 | 1 | 1 |
| 1 | 1 | 0 | 0 |
| 1 | 1 | 0 | 0 |

FIG.5C

LEVEL 4

| 1 | 1 | 1 | 1 |
|---|---|---|---|
| 1 | 1 | 1 | 1 |
| 0 | 0 | 0 | 0 |
| 0 | 0 | 0 | 0 |

MULTILEVEL CODE FOR TRANSMISSION DEVICE

BACKGROUND OF THE INVENTION

The present invention is used in multilevel coded modulation to be applied to $2^m$-value quadrature amplitude modulation ($m \geq 4$, m: integer). The present invention relates to multilevel code modulation equipment capable of performing correct decoding constantly even if a phase ambiguity exists.

Although the present invention is developed for microwave radio, it can be extensively used in communications other than microwave radio.

Recently, introduction of error-correcting schemes with high correcting capabilities has been advanced in a digital microwave radio system for the purpose of improving the quality of transmission characteristics. Coded modulation has been studied as one of these schemes.

The coded modulation is a combination of mapping based on set partitioning and error-correction coding techniques, and is an error-correcting scheme superior in performance to conventional error-correcting schemes which are independent of modulation/demodulation techniques. Code construction methods are classified into multilevel coded modulation and trellis coded modulation (TCM). The multilevel coded modulation is described in detail in H. Imai, S. Hirakawa, "A New Multilevel Coding Method Using Error-Correction Codes", IEEE Trans. Inf. Theory, vol. IT-23, pp. 371–377. The details of the TCM are described in Ungerboeck, "Trellis-Coded Modulation with Redundant Signal Sets Part 1,2", IEEE Com. Mag., vol. 25, pp. 5–21, Feb. 1987. Since the principle of the error correction is not related directly to the gist of the present invention, a detailed description thereof will be omitted.

It is impossible for quadrature amplitude modulation (QAM) used in digital microwave radio to detect an absolute phase of a carrier on a receiving side, and so a 90° phase ambiguity exists. Generally, differential decoding is used to eliminate the influence of this phase ambiguity. Since, however, errors are doubled by this differential decoding, an error-correcting circuit is placed inside the differential decoding. Therefore, an error-correcting scheme for use in the QAM is required to have characteristics not influenced by this phase ambiguity. Codes meeting this condition are called transparent codes.

A code having the highest correcting capability in the TCM, i.e., a so-called Ungerboeck code is not transparent to 90° and 180° phase ambiguities. The code therefore cannot be correctly decoded except when it is demodulated with the same phase as that on a transmitting side. For this reason, however, an absolute phase can be detected on a receiving side from information obtained by a decoder, and this makes transmission of signals possible without performing differential decoding.

Figure 6:
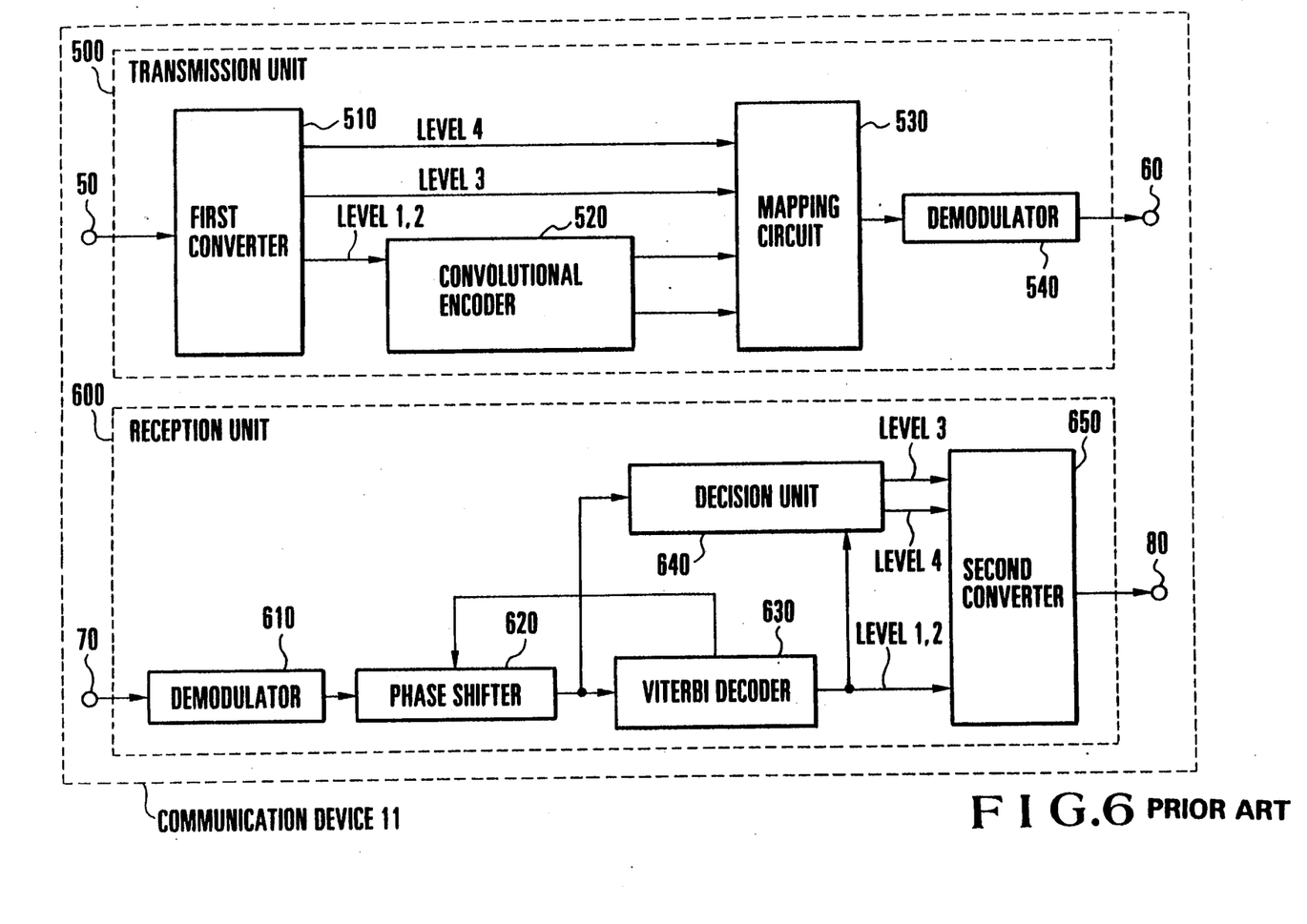
FIG. 6 is a block diagram showing the arrangement of a conventional device for performing Trellis Coded Modulation (TCM).

FIG. 6 is a block diagram showing 16QAM for encoding two lower levels, as an example of the TCM. Reference numeral 11 denotes a communication equipment constituted by a transmission unit 500 and a reception unit 600. An input serial signal from a terminal 50 of the transmission unit 500 is distributed to three portions by a first converter 510. In the TCM, unlike in the multilevel coded modulation, both signals of levels 1 and 2 are encoded by a single convolutional encoder 520. Signals of levels 3 and 4 which are distributed to uncoded levels are directly applied together with the signals of levels 1 and 2 which are encoded by the convolutional encoder 520 to a mapping circuit 530. The mapping circuit 530 outputs the coordinates of signal points corresponding to the input signals according to a signal arrangement based on set partitioning shown in FIG. 4. The output from the mapping circuit 530 is applied to a modulator 540 and 16QAM-modulated by the modulator 540. This modulated signal is output to a terminal 60.

The signal received by the reception unit 600 is applied to a terminal 70. A demodulator 610 demodulates the input signal, converting the signal into a digital signal. The output from the demodulator 610 is applied to a phase shifter 620. The phase shifter 620 executes a phase rotation of 0°, 90°, 180°, or 270° and supplies the resultant output to a Viterbi decoder 630 and a decision unit 640. Decoding operations of the levels 1 and 2 are performed by the Viterbi decoder 630, and decisions of the levels 3 and 4 as uncoded levels are performed by the decision unit 640. The decoding and decision results of the individual levels are applied to a second converter 650 and multiplexed into a serial signal. This serial signal is output to a terminal 80. The Viterbi decoder 630 can distinguish a phase difference of 0° between transmitted and received carriers from other phase differences in accordance with metric information used in decoding. Therefore, this information is used to control the phase shifter 620.

Since the TCM described above uses a single convolutional code, a degree of flexibility concerning setting of a maximum coding rate is small. Therefore, the TCM is difficult to use in digital microwave radio in which redundancy must be decreased as small as possible, i.e., a coding rate must be increased as high as possible.

In contrast, the multilevel coded modulation uses different codes at different levels in set partitioning, and so a degree of flexibility of setting a coding rate is larger than that of the TCM. Since the multilevel coded modulation has substantially the same characteristics as the TCM in correcting capability, the multilevel coded modulation can be said to be a coded modulation scheme suitable for the digital microwave radio. The multilevel coded modulation, however, has not been satisfactorily studied yet in its practical applications as compared with the TCM; for example, an application of the multilevel coded modulation to a communication system in which a phase ambiguity exists has not been sufficiently examined yet.

SUMMARY OF THE INVENTION

It is an object of the present invention to provide multilevel coded modulation equipment capable of constantly performing decoding even if a phase ambiguity is present.

In order to achieve the above object of the present invention, there is provided multilevel coded modulation equipment comprising a transmission unit including first converting means for distributing an input serial digital signal to a plurality of levels containing a level 1 indicating a level which is transparent to a 90° phase ambiguity, and a level 2 indicating a level which is transparent to a 180° phase rotation, first encoding means for encoding an output to the level 1 from the first converting means, differential encoding means for performing differential encoding for an output to the level 2 from the first converting means, second encoding means for encoding an output from the differential encoding means, mapping means for receiving outputs from the first and second encoding means and the first converting means, and outputting a signal indicating coordinates of signal points corresponding to the input signals, and modulating means for performing $2^m$-value quadrature amplitude modulation ($m \geq 4$, m: integer) on the basis of the output from the mapping means, and a reception unit including demodulating means for demodulating the modulated input signal which is subjected to the $2^m$-value quadrature amplitude modulation, thereby converting the signal into a digital signal, first decoding means for receiving an output from the demodulating means to perform decoding of the level 1, inverting means for inverting an output from the first decoding means on the basis of a control signal and outputting the inverted signal, phase shifting means for receiving the output from the demodulating means and rotating a phase of the received signal through 90° on the basis of a control signal, second decoding means for receiving outputs from the phase shifting means and the inverting means to perform decoding of the level 2, and outputting the control signal for controlling the phase shifting means and the inverting means in accordance with information obtained upon the decoding of the level 2, differential decoding means for performing differential decoding for an output from the second decoding means, decision means for receiving the output from the phase shifting means to decide an uncoded level, and second converting means for receiving the outputs from the inverting means, the differential decoding means, and the decision means, multiplexing the received signals into a serial digital signal, and outputting the serial digital signal.

DESCRIPTION OF THE PREFERRED EMBODIMENT

Figure 1:
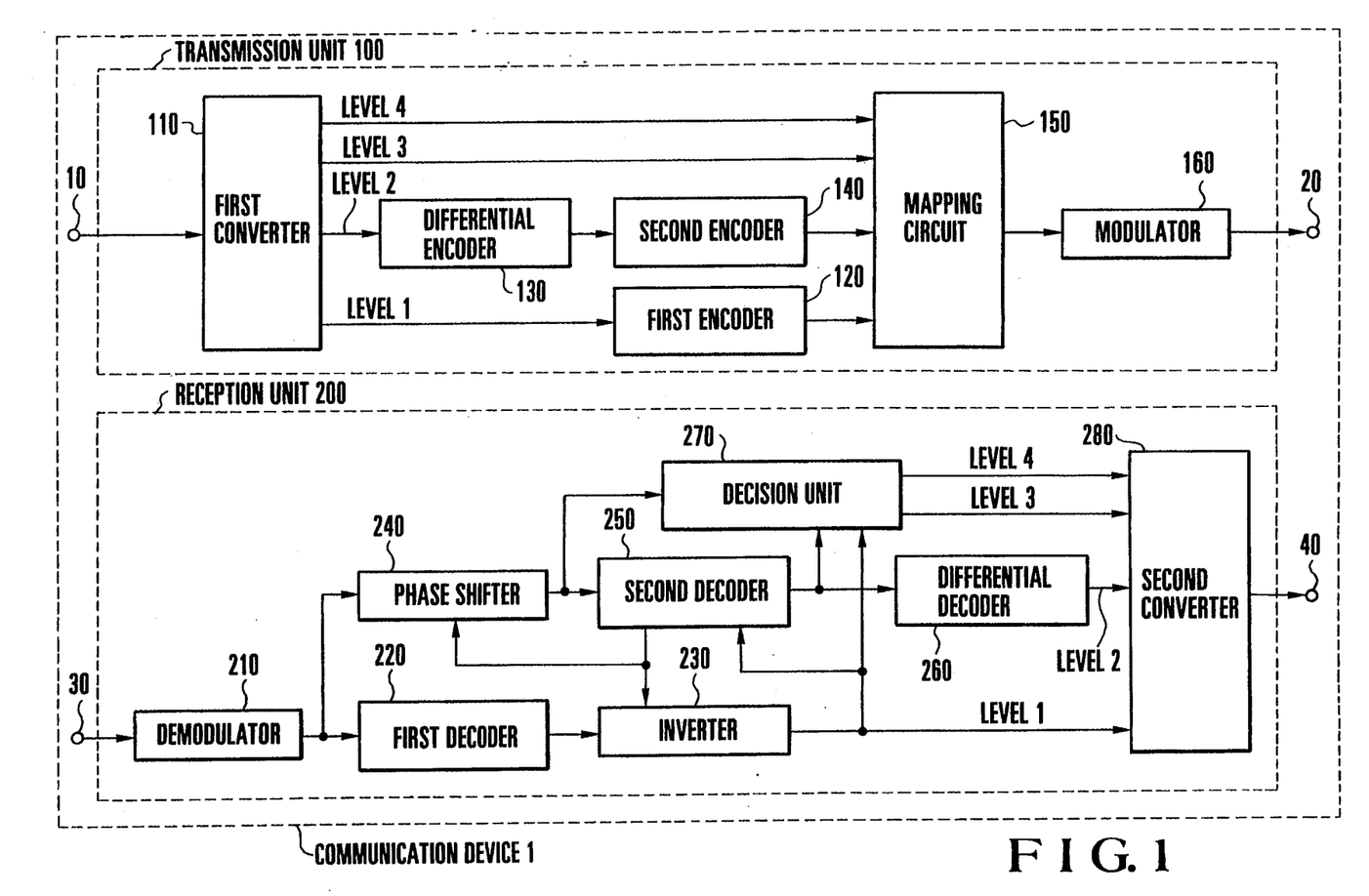
FIG. 1 is a block diagram showing an overall arrangement of an embodiment of multilevel coded modulation equipment according to the present invention.

The embodiment of the present invention will be described in detail below with reference to the accompanying drawings. FIG. 1 shows an overall arrangement of multilevel coded modulation equipment according to an embodiment of the present invention.

Figure 2A:
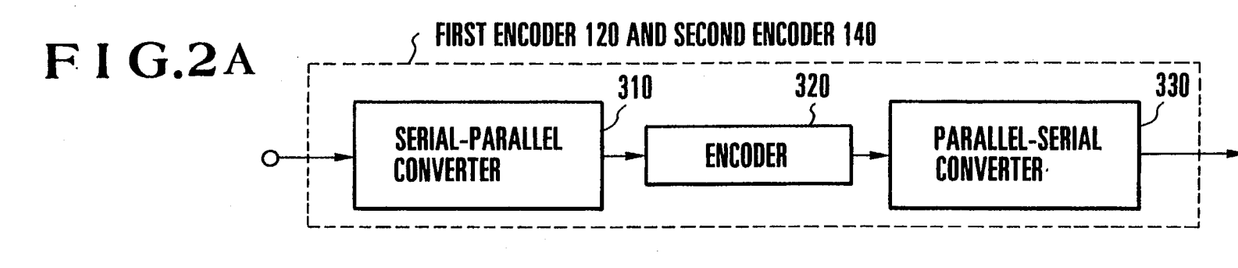
FIG. 2A is a block diagram showing an example of the arrangement of first and second encoders shown in FIG. 1.
Figure 2B:
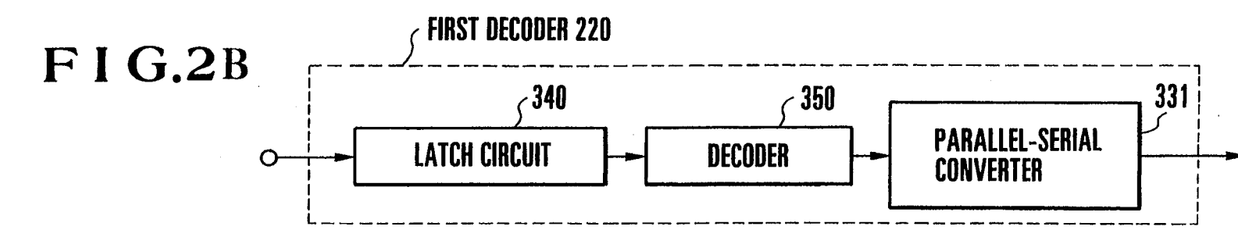
FIG. 2B is a block diagram showing an example of the arrangement of a first decoder shown in FIG. 1.
Figure 2C:
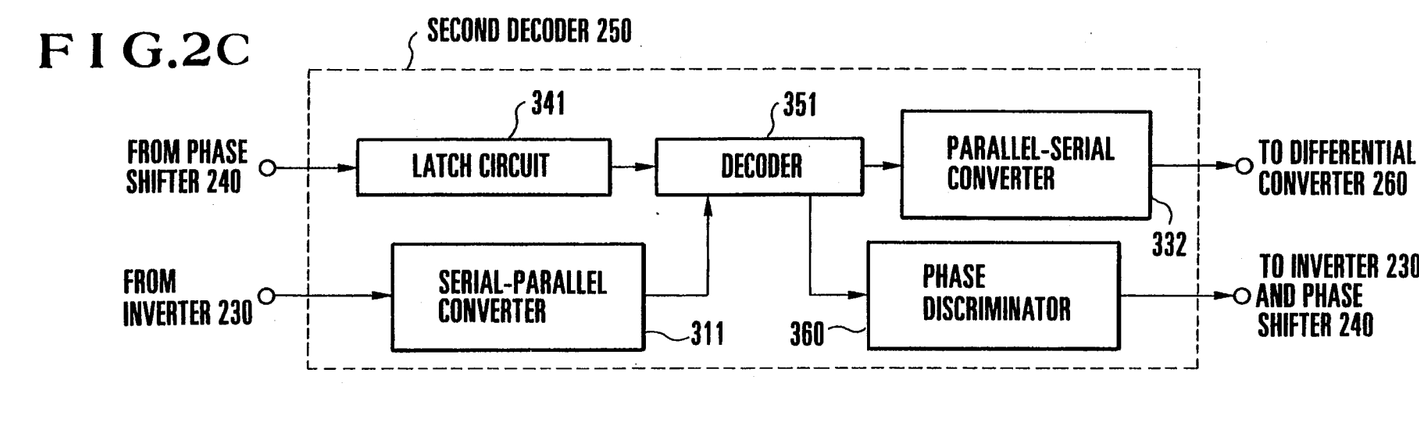
FIG. 2C is a block diagram showing an example of the arrangement of a second decoder shown in FIG. 1.
Figure 3A:
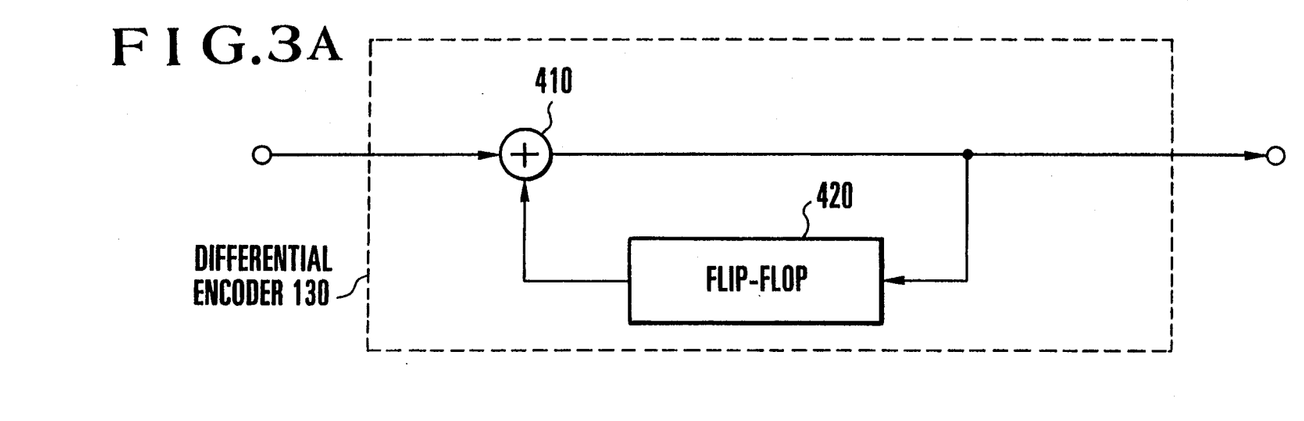
FIG. 3A is a block diagram showing an example of the arrangement of a differential encoder shown in FIG. 1.
Figure 3B:
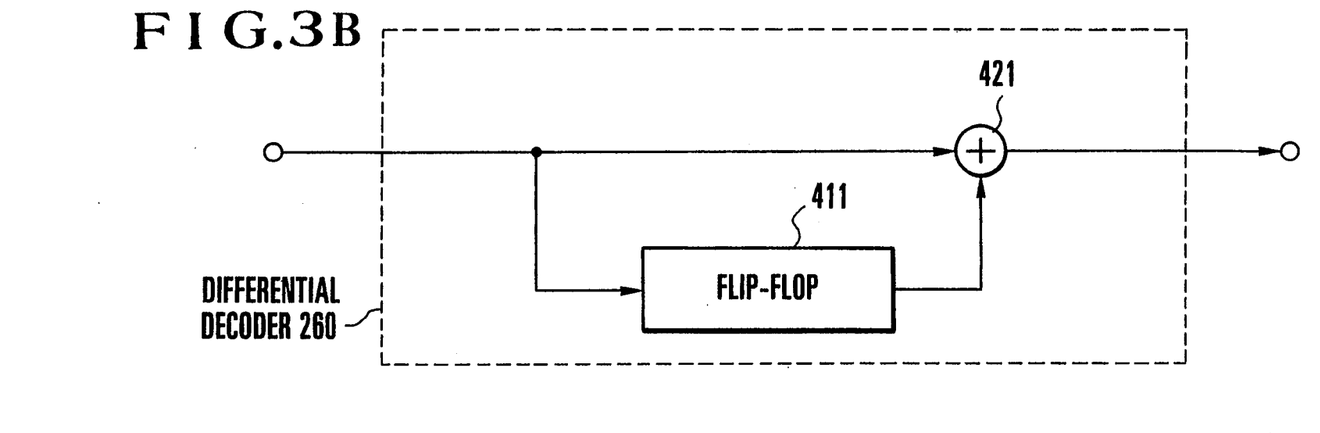
FIG. 3B is a block diagram showing an example of the arrangement of a differential decoder shown in FIG. 1.
Figure 4:
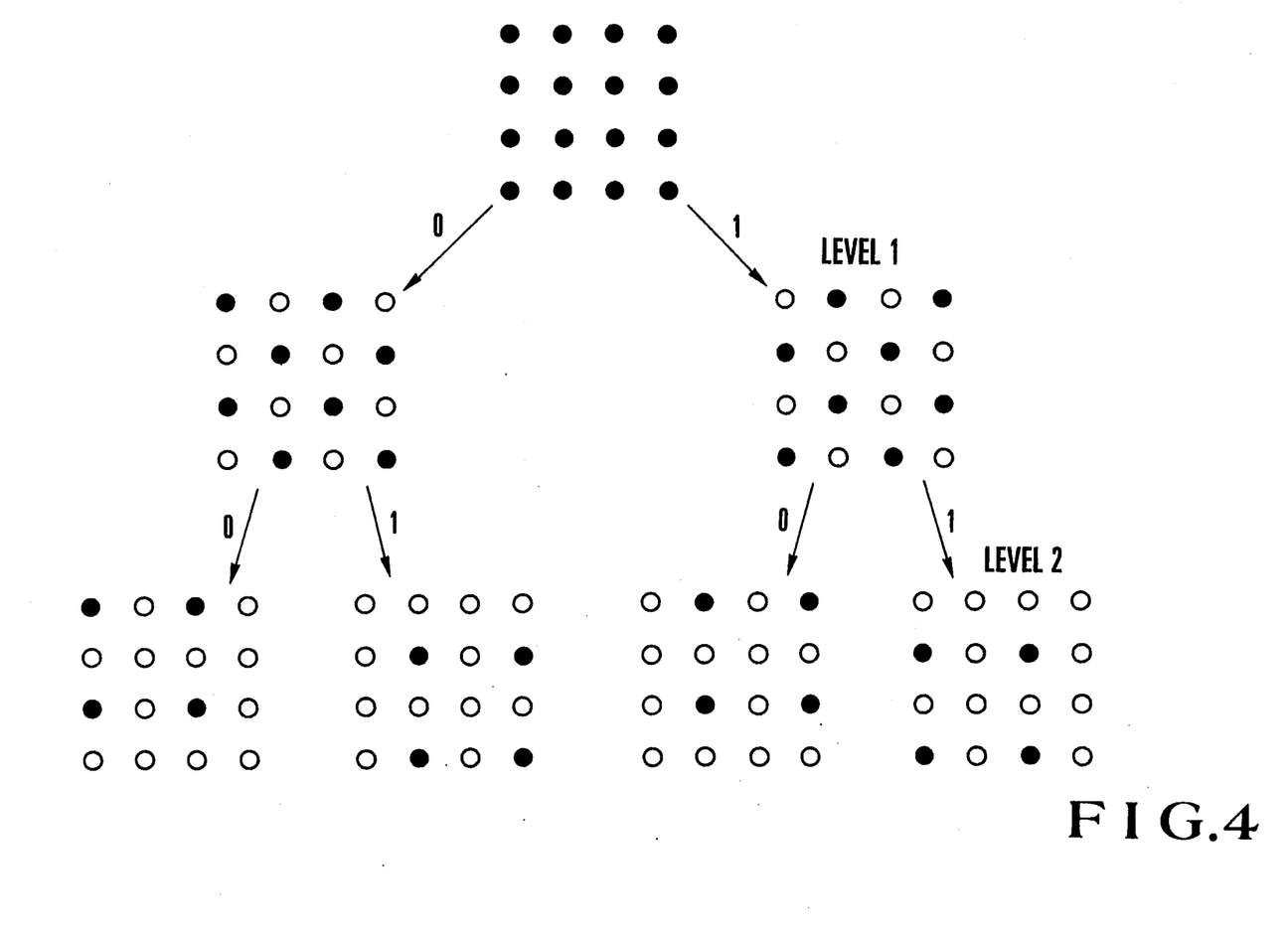
FIG. 4 is a view showing set partitioning according to the embodiment of the present invention.
Figure 5A:
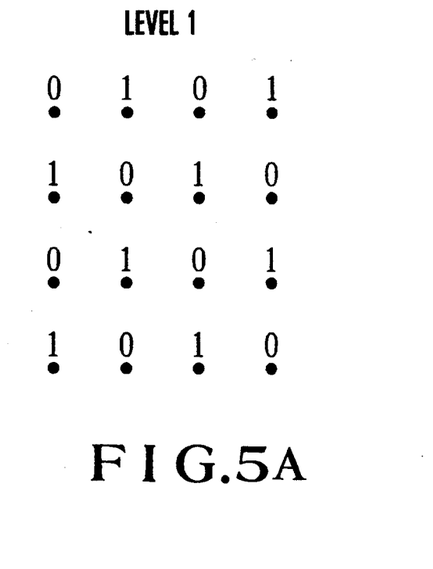
FIGS. 5A to 5D are views showing states of mapping of levels 1 to 4, respectively, according to the embodiment of the present invention.
Figure 5B:
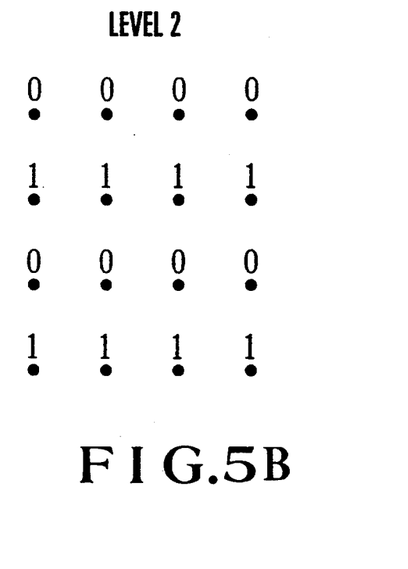
Figure 5C:
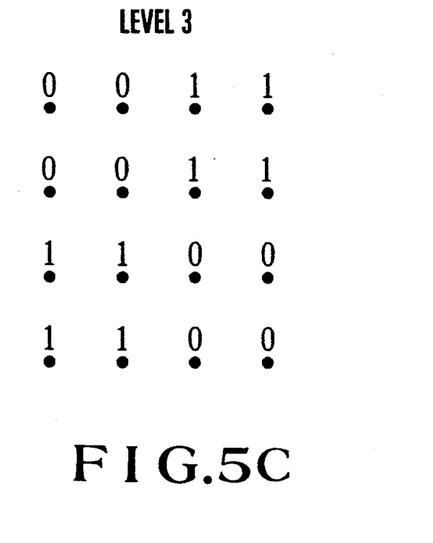
Figure 5D:
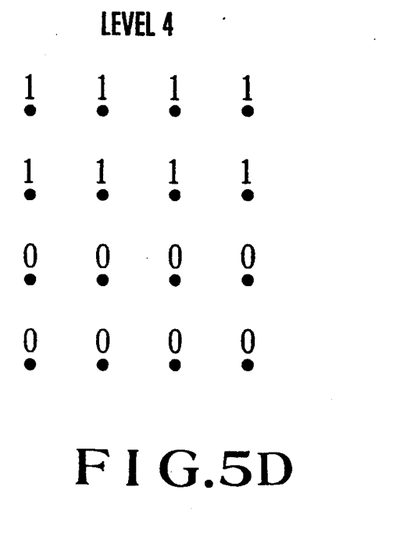

FIG. 2A shows an example of the arrangement of first and second encoders shown in FIG. 1, FIG. 2B shows an example of the arrangement of a first decoder shown in FIG. 1, and FIG. 2C shows an example of the arrangement of a second decoder shown in FIG. 1. FIG. 3A shows an example of the arrangement of a differential encoder shown in FIG. 1, and FIG. 3B shows an example of the arrangement of a differential decoder shown in FIG. 1. FIG. 4 shows set partitioning according to the embodiment of the present invention. FIGS. 5A to 5D show states of mapping of levels 1 to 4, respectively, according to the embodiment of the present invention.

A communication equipment of this embodiment comprises a transmission unit 100 and a reception unit 200 and performs multilevel coded modulation to be applied to $2^m$-value quadrature amplitude modulation ($m \geq 4$, m: integer) in which a level which is transparent to a 90° phase ambiguity is a level 1, a level which is transparent to a 180° phase rotation is a level 2, and two carriers with a phase difference of 90° are represented by amplitude-modulated signals.

The transmission unit 100 includes a first converter 110 for distributing an input serial signal from a terminal 10 to levels 1 to 4, a first encoder 120 for encoding an output to the level 1 from the first converter 110, a differential encoder 130 for performing differential encoding for an output to the level 2 from the first converter 110, a second encoder 140 for encoding an output from the differential encoder 130, a mapping circuit 150 for receiving an output from the first encoder 120, an output from the second encoder 140, and outputs to uncoded levels, i.e., the levels 3 and 4 from the first converter 110, and outputting the coordinates of signal points corresponding to the input signals, and a modulator 160 for modulating the output from the mapping circuit 150 and outputting the result to a terminal 20. The reception unit 200 includes a demodulator 210 for receiving the output modulated signal from the transmission unit 100 through a terminal 30 and demodulating the received signal, a first decoder 220 for receiving an output from the demodulator 210 and performing decoding of the level 1, an inverter 230 for inverting an output from the first decoder 220 in accordance with a control signal, a phase shifter 240 for receiving the output from the demodulator 210 and rotating the phase of the received signal through 90° by using logical conversion in accordance with the control signal, a second decoder 250 for receiving outputs from the phase shifter 240 and the inverter 230 to perform decoding of the level 2 and also generating the control signal for controlling the phase shifter 240 and the inverter 230 from information obtained by the decoding, a differential decoder 260 for performing differential decoding for an output from the second decoder 250, a decision unit 270 for receiving the output from the phase shifter 240 to perform decisions for uncoded levels, and a second converter 280 for receiving the outputs from the inverter 230, the differential decoder 260, and the decision unit 270 to multiplex these signals into one serial signal and outputting this serial signal.

The operation of 16QAM multilevel coded modulation performed by the device of the embodiment with the above arrangement, in which two lower levels are encoded, will be described below.

An input serial signal from the terminal 10 is distributed to four levels 1 to 4 by the first converter 110. A signal distributed to the level 1 is encoded by the first encoder 120. A signal distributed to the level 2 is summed by the differential encoder 130 and encoded by the second encoder 140. Signals distributed to the levels 3 and 4 as uncoded levels are directly applied together with the encoded signals of the levels 1 and 2 to the mapping circuit 150. The mapping circuit 150 outputs the coordinates of signal points corresponding to the input signals in accordance with a signal point arrangement based on set partitioning shown in FIG. 4. This coordinate output is applied to the modulator 160 and 16QAM-modulated, and the modulated signal is output to the terminal 20.

The signal received by the receiving side is applied to the terminal 30. The demodulator 210 demodulates the input signal, converting the signal into a digital signal. The output from the demodulator 210 is applied to the first decoder 220 and the phase shifter 240. The first decoder 220 performs decoding of the level 1, and the phase shifter 240 performs a phase rotation of 0° or 90°. An output from the first decoder 220 is applied to the inverter 230 and is either inverted under the control of the second decoder 250 or output intact in a positive phase. An output from the phase shifter 240 is applied to the second decoder 250 and the decision unit 270. The second decoder 250 performs decoding of the level 2 in accordance with the outputs from the phase shifter 240 and the inverter 230. The decision unit 270 performs decisions for the levels 3 and 4 as uncoded levels in accordance with the outputs from the phase shifter 240, the inverter 230, and the second decoder 250. The output from the second decoder 250 is differentially converted by the differential decoder 260. Outputs from the inverter 230, the differential decoder 260, and the decision unit 270 are applied to the second converter 280 and multiplexed into one serial signal. This serial signal is output to the terminal 40.

The characteristics of the multilevel coded modulation with respect to phase ambiguity will be described. The multilevel coded modulation makes use of different codes at different levels by assuming that levels of set partitioning are independent channels. As an example, allocation of information to signal points from the levels 1 to 4 in 16QAM is as shown in FIGS. 5A to 5D, in which outputs from encoders correspond to signal points. As can be seen from FIGS. 5A to 5D, at the levels 1 and 3, i.e., at levels of odd numbers, information of all signal points are inverted by rotations of ±90° but remain unchanged by a rotation of 180°. At the levels 2 and 4, i.e., at levels of even numbers, on the other hand, information of half the number of signal points are inverted and information of the remaining half remain unchanged by rotations of ±90°, but information of all the signal points are inverted by a rotation of 180°.

If, therefore, a code in which a code word whose 0 and 1 are inverted is also a code word is used, it is possible to construct a code which is transparent to a 90° phase ambiguity at odd-number levels, and a code which is transparent to a 180° phase ambiguity at even-number levels. Since this condition that the inversion of a code word is also a code word is not an unusual condition, it is easy to construct a code which is transparent to a 180° phase ambiguity in the multilevel coded modulation as a whole.

In this case, however, although a code can be decoded correctly if it is demodulated at a phase of 0° or 180° with respect to a transmitted phase, it is impossible to detect a unique absolute phase unlike in TCM, so a 180° phase ambiguity is left behind. The present invention has solved this problem.

The operations of the individual components shown in FIG. 1 will be described in details below. Assume that codes used at the levels 1 and 2 satisfy the above condition that the inversion of a code word is also a code word.

The first converter 110 distributes an input serial signal to the individual levels by signal quantities that are determined in accordance with the respective coding rates of these levels. For example, if the coding rates of the levels 1 and 2 are ⅔ and 5/6, respectively, the signal quantity ratio of the levels 1 and 2 and the level 3 or 4 as an uncoded level is 4:5:6.

Each of the first and second encoders 120 and 140 has an arrangement as shown in FIG. 2A. Referring to FIG. 2A, a serial-parallel converter 310 for converting an input serial signal into a signal having the number of input bits of an encoder 320 is connected to the input of the encoder 320, and a parallel-serial encoder 330 for converting an output signal from the encoder 320 into a serial signal is connected to the output of the encoder 320. The encoder 320 performs error-correction coding for an input signal, adding a redundancy bit to the signal, and outputting the resulting signal. Note that the type of a code is not particularly limited, so either a convolutional code or a block code can be used.

The differential encoder 130 performs differential encoding for 2 PSK and is constituted by an EX-OR gate 410 and a flip-flop 420 as shown in FIG. 3A. The mapping circuit 150 carries out allocation of bits to signal points on the basis of the set partitioning shown in FIG. 4. An uncoded level is arranged by a 90° or 180° phase symmetry. The circuit can be realized by a simple logical circuit or a ROM (Read-Only Memory). The modulator 160 performs 16-value quadrature amplitude modulation for a 4-bit input signal from the mapping circuit 150 and outputs the modulated signal.

The demodulator 210 performs quadrature synchronous detection for the input modulated signal. Thereafter, a discriminator such as an analog-to-digital (A/D) converter performs soft decision and converts the signal into a digital signal. As shown in FIG. 2B, the first decoder 220 includes a latch circuit 340, a decoder 350, and a parallel-serial converter 331. The first decoder 220 performs decoding of the level 1 from the soft decision received signal having the number of output bits from the first encoder 120. The first decoder 220 then performs parallel-serial conversion for the resulting signal and outputs the result. Since the level 1 is transparent to a 90° phase ambiguity, correct decoding can be executed constantly regardless of the phase of a reproduced carrier from the demodulator 210. The output data, however, is inverted when the phase difference between transmitted and received carriers is 90° or 270°. In this case, therefore, the output data is inverted by the inverter 230 in accordance with a control signal from the second decoder 250.

The phase shifter 240 digitally rotates the phase of the soft decision received signal by about 90° by using a logical circuit in accordance with a control signal from the second decoder 250, or directly outputs the received signal. As shown in FIG. 2C, the second decoder 250 includes a latch circuit 341 for receiving the output from the phase shifter 240, a decoder 351, a parallel-serial converter 332 for transferring a signal to the differential decoder 260, a serial-parallel converter 311 for receiving the output from the inverter 230, and a phase discriminator 360 for applying a signal to the inverter 230 and the phase shifter 240. The second decoder 250 performs decoding of the level 2 from the soft decision received signal from the phase shifter 240, which has the number of output bits of the second encoder 140, and the decoding result of the level 1 which is the output from the inverter 230. The decoding of the level 2 is carried out in signal points limited from 16 to 8 points in accordance with the decoding result of the level 1. Therefore, the delays of the decoding result of the level 1 and the soft decision signal are matched in advance. Since the level 2 is transparent to only a 180° phase ambiguity, decoding cannot be executed correctly if the phase difference between transmitted and received carriers is 90° or 270°.

At this point, the second decoder 250 provides information indicating that a large number of code errors, such as syndrome error pulses or parity error pulses in the case of a block code, and path metric values of a Viterbi decoder in the case of a convolutional code, are present compared to the case in which the phase difference is 0° or 180°. Therefore, the phase discriminator 360 checks on the basis of this information whether the phase difference between the carriers is one of 90° and 270° or one of 0° or 180°, and outputs a signal for controlling the phase shifter 240 and the inverter 230, such that the phase of an input signal to the second decoder 250 is 0° or 180° at any instant.

The differential decoder 260 is a circuit for performing differential decoding for 2 PSK and is constituted by an EX-OR gate 411 and a flip-flop 421 as shown in FIG. 3B. Although the output from the second decoder 250 is inverted when the phase difference between the carriers is 180°, it is impossible to determine whether the phase difference is 0° or 180°. Therefore, an inverter such as the one for the level 1 cannot be used, and differential decoding is required so as not to be influenced by the phase difference.

More specifically, the decoding result of the level 1 is not at all influenced when the phase difference between the carriers is 180°. If the phase difference is ±90°, however, the decoding result is inverted although decoding itself is possible. Therefore, the decoding result is inverted by the inverter 230 in accordance with the control signal from the second decoder 250. The level 2, on the other hand, cannot be decoded correctly when the phase difference is ±90°. Therefore, the second decoder 250 detects this phase difference on the basis of the information indicating occurrence of errors, and the phase shifter 240 rotates the phase of an input signal to the second decoder and the uncoded level decision unit 270 through 90°. The influence of the phase rotation is eliminated from the decoding result when the phase difference is 180° by the differential encoder 130 and the differential decoder 260.

From four signal points limited by the use of the decoding results of the levels 1 and 2, the decision unit 270 selects a signal point closest to the reception point that is subjected to the soft decision. The mapping circuit 150 outputs information about an uncoded level allocated to that signal point. The second converter 280 multiplexes the decoding results of the levels 1 and 2 and the decision result for the uncoded level into a serial signal by an operation which is the reverse of the operation performed by the first converter 110.

The 16QAM multilevel coded modulation in which two lower bits are encoded has been described above. The present invention, however, is also applicable directly to other QAM schemes with larger numbers of values because only the number of uncoded levels is increased in these schemes. In addition, even if the number of levels to be encoded is three or more, since odd-number levels and even-number levels have the same characteristics as those of the level 1 and the level 2, respectively, the present invention can be similarly applied.

According to the present invention as described above, there is provided an effect of performing correct decoding constantly even if a phase ambiguity exists in level coded modulation which is applied to quadrature amplitude modulation.

What is claimed is:

1. Multilevel coded modulation equipment, comprising:

a transmission unit including:

first converting means for distributing an input serial digital signal to a plurality of levels containing a level 1 indicating a level which is transparent to a 90° phase ambiguity, and a level 2 indicating a level which is transparent to a 180° phase rotation, first encoding means for encoding an output to the level 1 from said first converting means, differential encoding means for performing differential encoding for an output to the level 2 from said first converting means, second encoding means for encoding an output from said differential encoding means, mapping means for receiving outputs from said first and second encoding means and said first converting means, and outputting a signal indicating coordinates of signal points corresponding to the input serial digital signal, and modulating means for performing $2^m$-value quadrature amplitude modulation ($m \geq 4$, m: integer) on the basis of the output from said mapping means; and a reception unit including:

demodulating means for demodulating the modulated input signal which is subjected to the $2^m$-value quadrature amplitude modulation, thereby converting the signal into a digital signal, first decoding means for receiving an output from said demodulating means to perform decoding of the level 1, inverting means for inverting an output from said first decoding means on the basis of a control signal and outputting an inverted signal, phase shifting means for receiving the output from said demodulating means and rotating a phase of the received signal through 90° on the basis of the control signal, second decoding means for receiving outputs from said phase shifting means and said inverting means to perform decoding of the level 2, and outputting the control signal for controlling said phase shifting means and said inverting means in accordance with information obtained upon the decoding of the level 2, differential decoding means for performing differential decoding for an output from said second decoding means, decision means for receiving the output from said phase shifting means to decide an uncoded level, and second converting means for receiving the outputs from said inverting means, said differential decoding means, and said decision means, multiplexing the received signals into a serial digital signal, and outputting the serial digital signal.

2. The equipment according to claim 1, wherein when a phase difference between carriers is 90° or 270°, said inverting means inverts the decoding result of the level 1 from said first decoding means and outputs the inverted signal in accordance with the control signal from said second decoding means, and said phase shifting means shifts a phase of the decoding result of the level 2 from said demodulating means through 90°.

3. The equipment according to claim 1, wherein said second decoding means includes a decoder for receiving the outputs from said phase shifting means and said inverting means to perform decoding of the level 2 on the basis of the decoding result of the level 1, and outputting the decoding result of the level 2 to said differential decoding means, and a phase discriminator for discriminating a phase difference between carriers on the basis of error information from said decoder and outputting the control signal to said phase shifting means and said inverting means such that the phase of the input signal to said second decoding means is 0° or 180° at any instant.

4. A transmission device for multilevel coded modulation equipment, comprising:
converting means for distributing an input serial digital signal to a level 1 indicating a level which is transparent to a 90° phase ambiguity, and a level 2 indicating a level which is transparent to a 180° phase rotation;
first encoding means for encoding an output to the level 1 from said converting means;
differential encoding means for performing differential encoding for an output to the level 2 from said converting means;
second encoding means for encoding an output from said differential encoding means;
mapping means for receiving outputs from said first and second encoding means and said converting means, and outputting a signal indicating coordinates of signal points corresponding to the input serial digital signal; and
modulating means for performing $2^m$-value quadrature amplitude modulation ($m \geq 4$, m: integer) on the basis of the output from said mapping means.

5. A transmission device as claimed in claim 4, wherein said first encoding means comprises an error correction encoder for error-correction coding said output to the level 1 from said converting means.

6. A transmission device as claimed in claim 5, wherein said first encoding means further comprises:
a serial-parallel converter for converting said output to the level 1 from said converting means into a parallel signal and inputting said parallel signal to said error correction encoder; and
a parallel-serial converter for converting an output from said error correction encoder into a serial signal and outputting said serial signal as the output of said first encoding means.

7. A transmission device as claimed in claim 5, wherein said error correction encoder adds a redundancy bit to said output to the level 1 from said converting means.

8. A reception device for multilevel coded modulation equipment, comprising:
demodulating means for demodulating a modulated input signal which is subjected to $2^m$-value quadrature amplitude modulation ($m \geq 4$, m: integer), thereby converting the signal into a digital signal;
first decoding means for receiving an output from said demodulating means to perform decoding of a level 1;
inverting means for inverting an output from said first decoding means on the basis of a control signal and outputting an inverted signal;
phase shifting means for receiving the output from said demodulating means and rotating a phase of the received signal through 90° on the basis of the control signal;
second decoding means for receiving outputs from said phase shifting means and said inverting means to perform decoding of a level 2, and outputting the control signal for controlling said phase shifting means and said inverting means in accordance with information obtained upon the decoding of the level 2;
differential decoding means for performing differential decoding for an output from said second decoding means;
decision means for receiving the output from said phase shifting means to decide an uncoded level; and
converting means for receiving the outputs from said inverting means, said differential decoding means, and said decision means, multiplexing the received signals into a serial digital signal, and outputting the serial digital signal.

9. The device according to claim 8, wherein when a phase difference between carriers is 90° or 270°, said inverting means inverts the decoding result of the level 1 from said first decoding means and outputs the inverted signal in accordance with the control signal from said second decoding means, and said phase shifting means shifts a phase of the decoding result of the level 2 from said demodulating means through 90°.

10. A device according to claim 8, wherein said second decoding means includes a decoder for receiving the outputs from said phase shifting means and said inverting means to perform decoding of the level 2 on the basis of the decoding result of the level 1, and outputting the decoding result of the level 2 to said differential decoding means, and a phase discriminator for discriminating a phase difference between carriers on the basis of error information from said decoder and outputting the control signal to said phase shifting means and said inverting means such that the phase of the input signal to said second decoding means is 0° or 180° at any instant.

* * * * *